United States Patent
Kim

(10) Patent No.: US 7,440,345 B2
(45) Date of Patent: Oct. 21, 2008

(54) DATA OUTPUT CIRCUIT OF SEMICONDUCTOR MEMORY DEVICE AND OPERATION METHOD THEREOF

(75) Inventor: Kwang Hyun Kim, Kyeongki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 89 days.

(21) Appl. No.: 11/489,688

(22) Filed: Jul. 20, 2006

(65) Prior Publication Data

US 2007/0133313 A1 Jun. 14, 2007

(30) Foreign Application Priority Data

Dec. 7, 2005 (KR) .................... 10-2005-0118982

(51) Int. Cl.
*G11C 7/00* (2006.01)

(52) U.S. Cl. .............. 365/196; 365/189.16; 365/230.06

(58) Field of Classification Search ............ 365/189.04, 365/189.16, 230.06, 196
See application file for complete search history.

(56) References Cited

U.S. PATENT DOCUMENTS

2005/0152210 A1* 7/2005 Park et al. ................... 365/233

FOREIGN PATENT DOCUMENTS

| KR | 100188021 | 1/1999 |
|---|---|---|
| KR | 100206917 | 4/1999 |
| KR | 1020010059962 | 7/2001 |
| KR | 1020010065829 | 7/2001 |
| KR | 1020050066198 | 6/2005 |

* cited by examiner

*Primary Examiner*—Thong Q Le
(74) *Attorney, Agent, or Firm*—Lowe Hauptman Ham & Berner LLP

(57) ABSTRACT

A data output circuit of a semiconductor memory device and an operation method thereof, in which global I/O lines are selectively used according to a selected output data width. The data output circuit includes an I/O sense amplifier unit that selectively senses and amplifies a part or all of read data received from a memory bank through a Local Input and Output (LIO) lines and outputs amplified data to a part of all of Global I/O (GIO) lines, respectively, in response to a data width selection signal, a pipeline latch unit that latches the amplified data received through a part or all of the GIO lines and outputs latched data, in response to latch control signals, and an output driver circuit unit that outputs output data in response to the latched data. The number of the output data is changed according to an output data width selected by the data width selection signal.

34 Claims, 5 Drawing Sheets

DATA OUTPUT CIRCUIT OF SEMICONDUCTOR MEMORY DEVICE AND OPERATION METHOD THEREOF

BACKGROUND

1. Field of the Invention

The present invention generally relates to semiconductor memory devices, and more particularly, to a data output circuit of a semiconductor memory device and an operation method thereof.

2. Discussion of Related Art

In general, a semiconductor memory device includes a data output circuit that amplifies data read from a core circuit having memory cells and outputs the amplified data to the outside in a read operation. The construction and operation of the data output circuit will be described in more detail below with reference to FIG. 1.

FIG. 1 is a schematic block diagram of a data output circuit and memory banks of a semiconductor memory device in the related art.

Referring to FIG. 1, a data output circuit 10 includes Input and Output (IO) sense amplifier units AM1 to AMK (K is an integer), a multiplexer circuit unit 11, a pipeline latch unit 12, and an output driver circuit unit 13.

Each of the I/O sense amplifier units AM1 to AMK includes sense amplifiers A1 to A32 respectively connected between local I/O lines LIO1 to LIO32 and global I/O lines GIO1 to GIO32 of each of memory banks MB1 to MBK.

The multiplexer circuit unit 11 includes multiplexers MX1 to MX16. Each of the multiplexers MX1 to MX16 is connected to two global I/O lines. For example, the multiplexer MX1 may be connected to the global I/O lines GIO1, GIO32 and the multiplexer MX2 may be connected to the global I/O lines GIO2, GIO31. Furthermore, the multiplexer MX16 is connected to the global I/O lines GIO16, GIO17.

The multiplexers MX1 to MX16 select data received from one of the two global I/O lines connected thereto in response to a control address signal XADD. For example, the multiplexer MX1 may output data received through one of the global I/O lines GIO1, GIO32 in response to the control address signal XADD.

The pipeline latch unit 12 includes latch circuits PLT1 to PLT32. The latch circuits PLT1 to PLT16 latch read data RDO1 to RDO16 respectively received from the multiplexers MX1 to MX16 in response to latch signals LC1 to LC16, respectively, and output latched data. The latch circuits PLT17 to PLT32 latch data respectively received from the global I/O lines GIO17 to GIO32 in response to the latch signals LC17 to LC32, respectively, and output latched data.

The output driver circuit unit 13 includes output drivers DRV1 to DRV32. The output drivers DRV1 to DRV32 output output data ODAT1 to ODAT32, respectively, in response to the read data RDO1 to RDO32 respectively received from the latch circuits PLT1 to PLT32.

An output data width of the semiconductor memory device including the data output circuit 10 is X16 or X32 and can be selectively changed. That is, the data output circuit 10 has the function of changing the output data width.

In more detail, the data output circuit 10 employs only the output drivers DRV1 to DRV16 and outputs 16-bit data when the output data width is set to X16, and outputs 32-bit data employing the whole output drivers DRV1 to DRV32 when the output data width is set to X32.

Meanwhile, when the output data width of the semiconductor memory device is set to X16, the multiplexers MX1 to MX16 must select read data loaded on the global I/O lines GIO1 to GIO16 or must select read data loaded on the global I/O lines GIO17 to GIO32. A row address signal may be used as a signal to control the operation of selecting the multiplexers MX1 to MX16.

In general, the row address signal for controlling the operation of selecting the multiplexers MX1 to MX16 is input once when an active command is input to the semiconductor memory device, but is not input when a read command is input to the semiconductor memory device. Therefore, when the active command is input to the semiconductor memory device, the multiplexers MX1 to MX16 select the read data loaded on the global I/O lines GIO to GIO16 or GIO17 to GIO32 according to the row address signal and output the selected data.

However, in the case where the data stored in the memory banks MB1, MBK are sequentially read with plural ones (for example, MB1, MBK) of the memory banks MB1 to MBK being active, there is a problem in which the multiplexers MX1 to MX16 may select erroneous read data, resulting in failure in the read operation.

In more detail, there may be cases in which the data output circuit 10 must output the read data loaded on the local I/O lines LIO1 to LIO16 to the memory bank MB1 and the data output circuit 10 must output the read data loaded on the local I/O lines LIO17 to LIO32 to the memory bank MBK. In this case, in the event that the multiplexers MX1 to MX16 are set to select the read data loaded on the global I/O lines GIO1 to GIO16 according to the row address signal input along with the active command, the read operation of the memory bank MB1 may be normally performed, but the read operation of the memory bank MBK cannot be normally performed.

As described above, in the data output circuit 10, when the output data width is X16, the multiplexers MX1 to MX16 select the read data respectively loaded on some (GIO1 to GIO16 or GIO17 to GIO32) of the global I/O lines GIO1 to GIO32 and output selected data. Accordingly, when the read operations of the plurality of memory banks are sequentially executed, a problem arises because failure occurs in the read operation.

SUMMARY OF THE INVENTION

An embodiment of the present invention is that it provides a data output circuit of a semiconductor memory device, in which some or all of global I/O lines are selectively used according to a selected output data width during the read operation, thereby reducing the ratio in which read operation failure occurs and reducing its occupation area.

Another embodiment of the present invention is that it provides a data output method of a semiconductor memory device, in which some or all of global I/O lines are selectively used according to a selected output data width during the read operation, thereby reducing the ratio in which read operation failure occurs and reducing its occupation area.

According to an aspect of the present invention, there is provided a data output circuit of a semiconductor memory device, including an I/O sense amplifier unit, a pipeline latch unit, and an output driver circuit unit. The I/O sense amplifier unit selectively senses and amplifies a part or all of read data received from a memory bank through a Local Input and Output (LIO) lines and outputs amplified data to a part of all of Global I/O (GIO) lines, respectively, in response to a data width selection signal. The pipeline latch unit latches the amplified data received through a part or all of the GIO lines and outputs latched data, in response to latch control signals. The output driver circuit unit outputs output data in response to the latched data. The number of the output data may be changed according to an output data width selected by the data width selection signal.

According to another aspect of the present invention, there is provided a data output circuit of a semiconductor memory device, including first to $M^{th}$ I/O sense amplifier units, a pipeline latch unit, and an output driver circuit unit. The first to $M^{th}$ I/O sense amplifier units are disposed corresponding to first to $M^{th}$ (M is an integer) memory banks one by one, and selectively sense and amplify a part or all of read data, which are received from the first to $M^{th}$ memory banks, and output amplified data to a part or all of GIO lines, respectively, in response to a data width selection signal. The pipeline latch unit latches the amplified data received through a part or all of the GIO lines and outputs latched data, in response to latch control signals. The output driver circuit unit outputs output data in response to the latched data. The number of the output data may be changed according to an output data width selected by the data width selection signal. Furthermore, when one of the first to $M^{th}$ I/O sense amplifier units outputs the amplified data to a part or all of the GIO lines, respectively, the remaining ones of the first to $M^{th}$ I/O sense amplifier units may stop an output operation of the amplified data.

According to further another aspect of the present invention, there is provided a data output method of a data output circuit included in a semiconductor memory device having a plurality of memory banks, including the steps of when a part or all of the plurality of memory banks are activated, selectively sensing and amplifying a part or all of read data of each of the activated memory banks in response to a data width selection signal, and sequentially outputting amplified data respectively corresponding to the activated memory banks to a part or all of GIO lines on the basis of amplified data corresponding to one memory bank; latching the amplified data received through a part or all of the GIO lines, respectively, and outputting latched data, in response to latch control signals; and outputting output data in response to the latched data. The number of the output data may be changed according to an output data width selected by the data width selection signal.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 1:
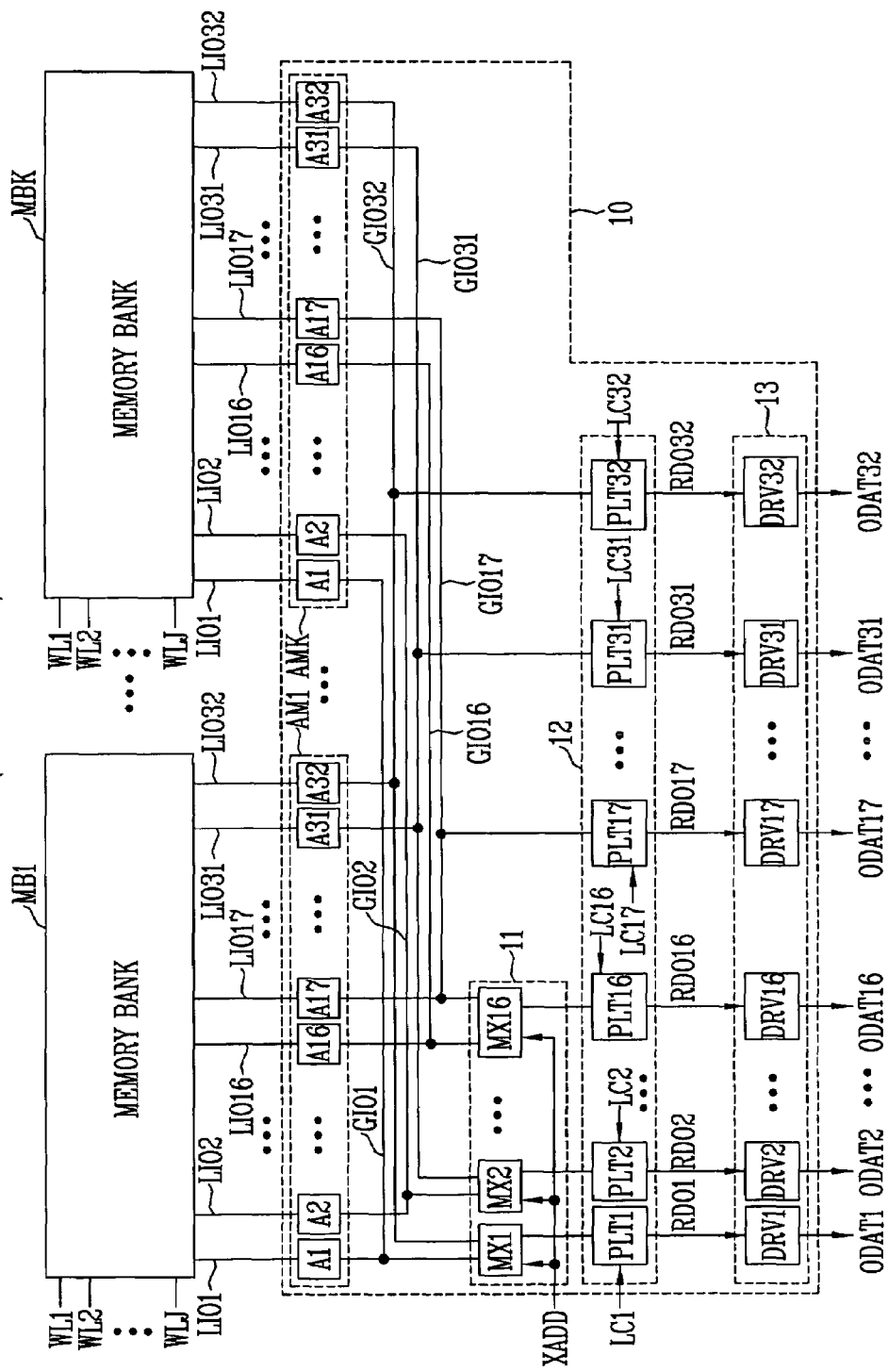
FIG. 1 is a schematic block diagram of a data output circuit and memory banks of a semiconductor memory device in the related art.
Figure 2:
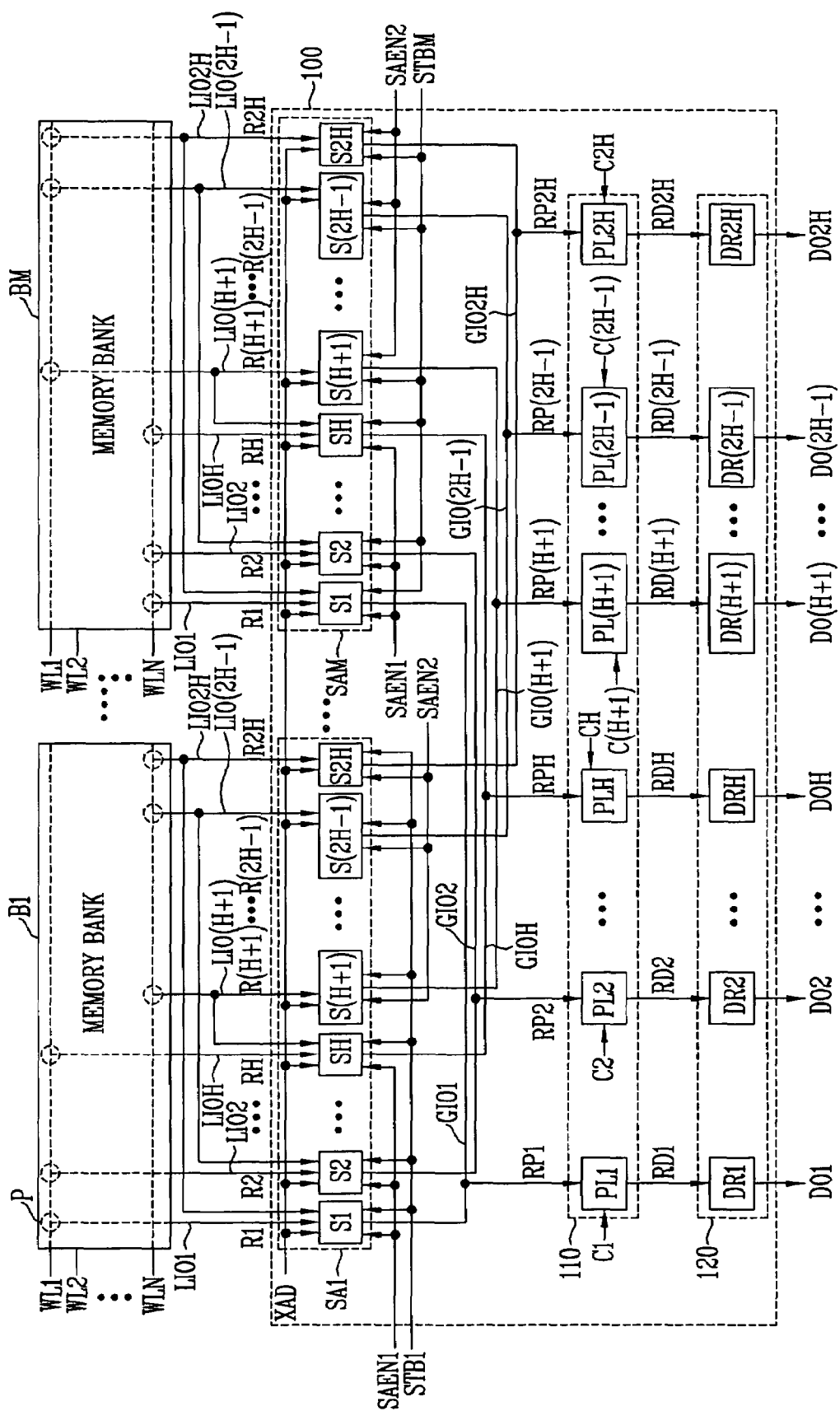
FIG. 2 is a block diagram of a data output circuit and memory banks of a semiconductor memory device according to an embodiment of the present invention.

FIG. 2 is a block diagram of a data output circuit and memory banks of a semiconductor memory device according to an embodiment of the present invention.

Referring to FIG. 2, a data output circuit 100 includes I/O sense amplifier units SA1 to SAM (M is an integer), a pipeline latch unit 110, and an output driver circuit unit 120.

The I/O sense amplifier units SA1 to SAM are disposed corresponding to memory banks B1 to BM, respectively. Each of the I/O sense amplifier units SA1 to SAM is connected to Local I/O (LIO) lines LIO1 to LIO2H (H is an integer) of each of the memory banks B1 to BM. The I/O sense amplifier units SA1 to SAM have the same construction and operation, and accordingly, only the construction and operation of the I/O sense amplifier unit SA1 will be described as an example.

The I/O sense amplifier unit SA1 includes sense amplifier circuits S1 to S2H (H is an integer). The sense amplifier circuits S1 to S2H are connected to the LIO lines LIO1 to LIO2H of the memory bank B1, respectively. The sense amplifier circuits S1 to SH are further connected to the LIO lines LIO2H to LIO(H+1), respectively. The sense amplifier circuits S1 to SH sense and amplify read data R1 to RH, which are received from the memory bank B1 through the LIO lines LIO1 to LIOH, respectively, or read data R2H to R(H+1), which are received from the memory bank B1 through the LIO lines LIO2H to LIO(H+1), respectively, in response to a data width selection signal XAD, and output amplified data RP1 to RPH to Global I/O (GIO) lines GIO1 to GIOH, respectively.

In the semiconductor memory device including the data output circuit 100, a row address signal, or an output data width set signal may be used as the data width selection signal XAD. For example, in the case of a semiconductor memory device in which the output data width is X16 or X32, the output data width set signal X16 or X32 may be used as the data width selection signal XAD.

Preferably, the data width selection signal XAD may be disabled when the output data width of the data output circuit 100 is set to H bits (i.e., XH) and may be enabled when the output data width of the data output circuit 100 is set to 2H bits (i.e., X2H). When the data width selection signal XAD is enabled, the sense amplifier circuits S1 to SH sense and amplify the read data R1 to RH, respectively. Furthermore, when the data width selection signal XAD is disabled, the sense amplifier circuits S1 to SH sense and amplify the read data R(H+1) to R2H or the read data R1 to RH, respectively.

Figure 3:
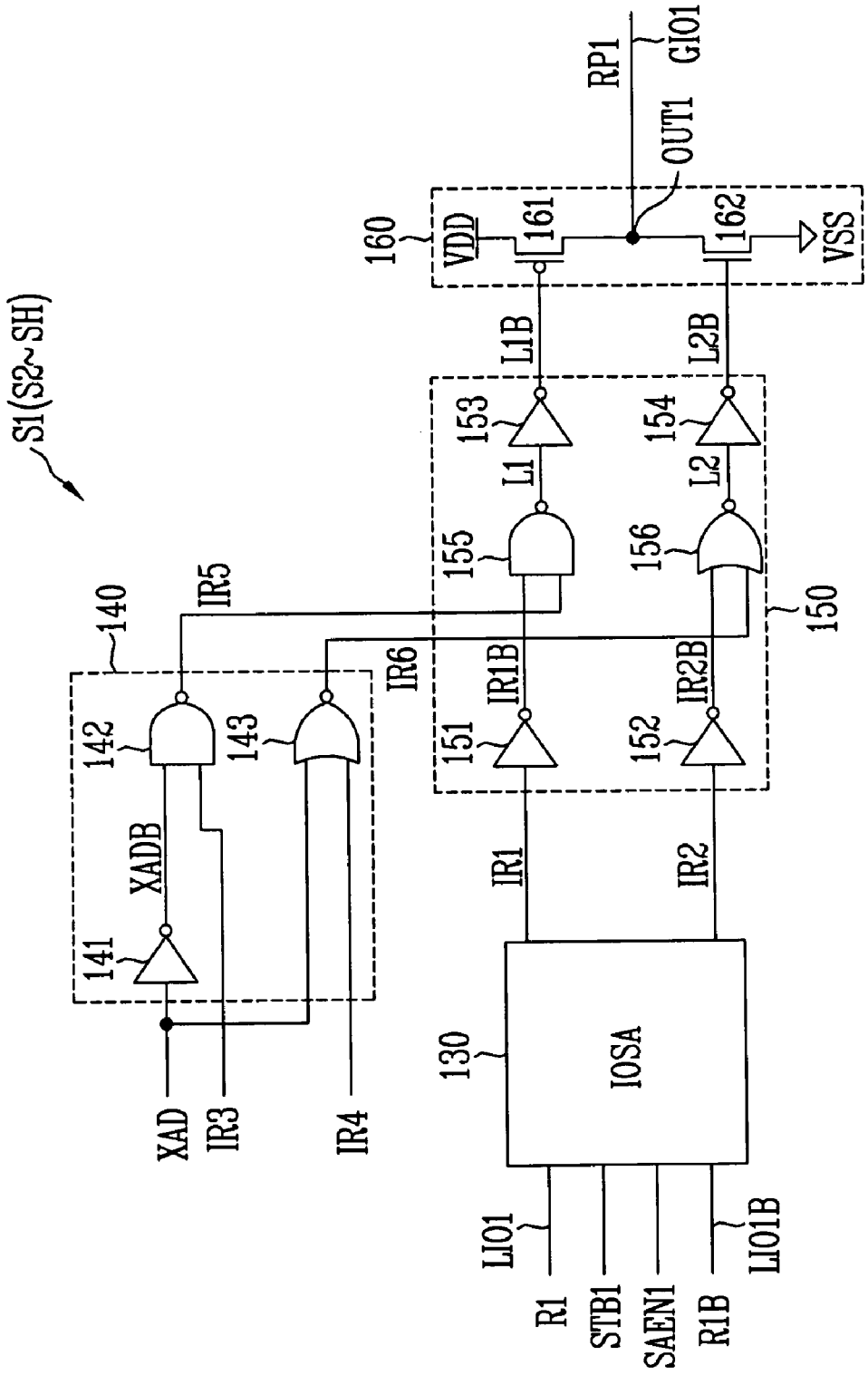
FIGS. 3 and 4 are detailed circuit diagrams of sense amplifier circuits shown in FIG. 2 according to an embodiment of the present invention.

The constructions and operations of the sense amplifier circuits S1 to SH will be described in more detail below with reference to FIG. 3. The constructions and operations of the sense amplifier circuits S1 to SH are the same, and accordingly, the construction and operation of the only the sense amplifier circuit S1 will be described as an example with reference to FIG. 3.

The sense amplifier circuit S1 includes an I/O Sense Amplifier (IOSA) 130, an output logic circuit 140, a control logic circuit 150, and a GIO driver 160.

The IOSA 130 is enabled or disabled in response to a sensing enable signal SAEN1. Preferably, when the sensing enable signal SAEN1 is enabled, the IOSA 130 may be enabled. A detailed construction of the IOSA 130 is well known to those skilled in the art and description thereof will be omitted. When being enabled, the IOSA 130 receives read data R1, R1B through a LIO line LIO1 and a LIO bar line LIO1B in synchronization with a strobe signal STB1. The IOSA 130 senses and amplifies the received read data R1, R1B and outputs internal amplified data IR1, IR2.

In more detail, the IOSA 130 senses and amplifies the read data R1, R1B and outputs both the internal amplified data IR1, IR2 as logical high or logical low. For example, when the read data R1 is a logical high, the IOSA 130 may output both the internal amplified data IR1, IR2 as logical highs. Meanwhile, when the read data R1 is a logical low, the IOSA 130 may output both the internal amplified data IR1, IR2 as logical lows.

When the IOSA 130 is disabled, the internal amplified data IR1 is fixed to a logical low and the internal amplified data IR2 is fixed to a logical high. Meanwhile, FIG. 2 shows only the LIO lines LIO1 to LIO2H of each of the memory banks B1 to BM, but each of the memory banks B1 to BM may further include LIO bar lines LIO1B to LIO2HB in reality.

The output logic circuit 140 includes an inverter 141, a NAND gate 142, and a NOR gate 143. The inverter 141 inverts the data width selection signal XAD and outputs an inverted data width selection signal XADB. The NAND gate 142 outputs an internal amplified data IR5 in response to the inverted data width selection signal XADB and an internal amplified data IR3. The NOR gate 143 outputs an internal amplified data IR6 in response to the data width selection signal XAD and an internal amplified data IR4. Consequently, the output logic circuit 140 maintains the internal amplified data IR5 to a logical high and maintains the internal amplified data IR6 to a logical low, regardless of the internal amplified data IR3, IR4, when the data width selection signal XAD is enabled.

Furthermore, if the internal amplified data IR3 are kept to a logical low and the internal amplified data IR4 are kept to a logical high when the data width selection signal XAD is disabled, the output logic circuit 140 maintains the internal amplified data IR5 to a logical high and the internal amplified data IR6 to a logical low.

Meanwhile, if both the internal amplified data IR3, IR4 are logical highs when the data width selection signal XAD is disabled, the output logic circuit 140 outputs both the internal amplified data IR5, IR6 as logical lows. If both the internal amplified data IR3, IR4 are logical lows when the data width selection signal XAD is disabled, the output logic circuit 140 outputs both the internal amplified data IR5, IR6 as logical highs.

The control logic circuit 150 includes inverters 151 to 154, a NAND gate 155, and a NOR gate 156.

The inverter 151 inverts the internal amplified data IR1 and outputs an inverted internal amplified data IR1B. The inverter 152 inverts the internal amplified data IR2 and outputs an inverted internal amplified data IR2B. The NAND gate 155 outputs an internal logic signal L1 in response to the internal amplified data IR5 and the inverted internal amplified data IR1B. The inverter 153 inverts the internal logic signal L1 and outputs an inverted signal as a control logic signal L1B. The NOR gate 156 outputs an internal logic signal L2 in response to the internal amplified data IR6 and the inverted internal amplified data IR2B. The inverter 154 inverts the internal logic signal L2 and outputs an inverted signal as a control logic signal L2B.

Consequently, when the internal amplified data IR5 is kept to a logical high and the internal amplified data IR6 is kept to a logical low, the control logic circuit 150 may output both the control logic signals L1B, L2B as logical lows or logical highs in response to the internal amplified data IR1, IR2.

In more detail, when both the internal amplified data IR1, IR2 are logical high, the control logic circuit 150 outputs both the control logic signals L1B, L2B as logical lows. Furthermore, when both the internal amplified data IR1, IR2 are logical lows, the control logic circuit 150 outputs both the control logic signals L1B, L2B as logical highs.

Furthermore, when the internal amplified data IR1 are kept to a logical low and the internal amplified data IR2 are kept to a logical high, the control logic circuit 150 may output both the control logic signals L1B, L2B as logical lows or logical highs in response to the internal amplified data IR5, IR6.

In more detail, when both the internal amplified data IR5, IR6 are logical highs, the control logic circuit 150 outputs both the control logic signals L1B, L2B as logical highs. Furthermore, when both the internal amplified data IR5, IR6 are logical lows, the control logic circuit 150 outputs both the control logic signals L1B, L2B as logical lows.

The GIO driver 160 includes a PMOS transistor 161 and a NMOS transistor 162.

The PMOS transistor 161 is connected between a power supply voltage VDD and an output node OUT1 and is turned on or off in response to the control logic signal L1B. The NMOS transistor 162 is connected between the output node OUT1 and a ground voltage VSS and is turned on or off in response to the control logic signal L2B.

Consequently, when any one of the PMOS transistor 161 and the NMOS transistor 162 is turned on, amplified data RP1 of a logical low or high are output from the output node OUT1.

Referring back to FIG. 2, the sense amplifier circuits S(H+1) to S2H sense and amplify read data R(H+1) to R2H, which are received through the LIO lines LIO(H+1) to LIO2H, respectively, in response to the data width selection signal XAD, and output amplified data RP(H+1) to RP2H to GIO lines GIO(H+1) to GIO2H, respectively, or stop the output operation.

Preferably, when the data width selection signal XAD is enabled, the sense amplifier circuits S(H+1) to S2H output the amplified data RP(H+1) to RP2H. When the data width selection signal XAD is disabled, the sense amplifier circuits S(H+1) to S2H stops the output operation of the amplified data RP(H+1) to RP2H.

Figure 4:
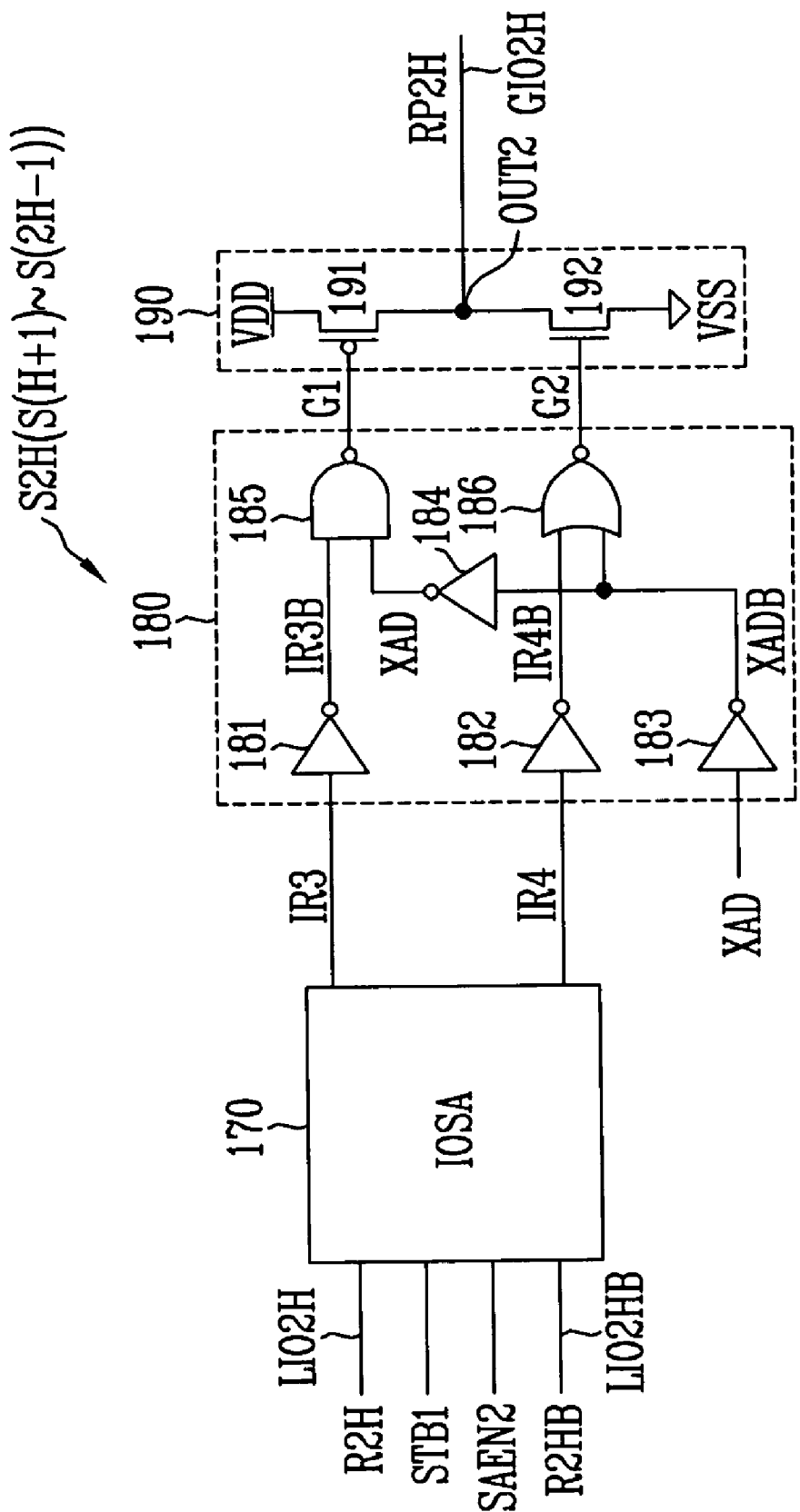

The constructions and operations of the sense amplifier circuits S(H+1) to S2H will be described in more detail below with reference to FIG. 4. The constructions and operations of the sense amplifier circuits S(H+1) to S2H are the same and accordingly, only the construction and operation of the sense amplifier circuit S2H will be described as an example below with reference to FIG. 4.

The sense amplifier circuit S2H includes an IOSA 170, a control logic circuit 180, and a GIO driver 190.

The IOSA 170 is enabled of disabled in response to a sensing enable signal SAEN2. Preferably, when the sensing enable signal SAEN2 is enabled, the IOSA 170 may be enabled. A detailed construction of the IOSA 170 is well known to those skilled in the art and description thereof will be omitted.

When being enabled, the IOSA 170 receives read data R2H, R2HB from the LIO line LIO2H and the LIO bar line LIO2HB in synchronization with the strobe signal STB1. The IOSA 170 senses and amplifies the received read data R2H, R2HB and outputs the internal amplified data IR3, IR4. In more detail, the IOSA 170 senses and amplifies the read data R2H, R2HB and outputs both the internal amplified data IR3, IR4 as logical highs or logical lows.

For example, when the read data R2H is a logical high, the IOSA 170 may output both the internal amplified data IR3, IR4 as logical highs. Furthermore, when the read data R2H is a logical low, the IOSA 170 may output both the internal amplified data IR3, IR4 as logical lows. Meanwhile, when the IOSA 170 is disabled, the internal amplified data IR3 is fixed to logical lows and the internal amplified data IR4 is fixed to logical highs.

The control logic circuit 180 includes inverters 181 to 184, a NAND gate 185, and a NOR gate 186.

The inverter 181 inverts the internal amplified data IR3 and outputs inverted internal amplified data IR3B. The inverter 182 inverts the internal amplified data IR4 and outputs inverted internal amplified data IR4B. The inverter 183 inverts the data width selection signal XAD and outputs inverted data width selection signal XADB. The inverter 184 inverts the inverted data width selection signal XADB again and outputs the data width selection signal XAD.

The NAND gate 185 outputs a control logic signal G1 in response to the inverted internal amplified data IR3B and the data width selection signal XAD received from the inverter 184. The NOR gate 188 outputs a control logic signal G2 in response to the inverted internal amplified data IR4B and the inverted data width selection signal XADB.

Consequently, when the data width selection signal XAD is enabled, the control logic circuit 180 outputs both the control logic signals G1, G2 as logical lows or logical highs in response to the internal amplified data IR3, IR4.

In more detail, when both the internal amplified data IR3, IR4 are logical highs, the control logic circuit 180 outputs both the control logic signals G1, G2 as logical highs. Furthermore, when both the internal amplified data IR3, IR4 are logical lows, the control logic circuit 180 outputs both the control logic signals G1, G2 as logic low. Meanwhile, when the data width selection signal XAD is disabled, the control logic circuit 180 outputs the control logic signal G1 as a logical high and the control logic signal G2 as a logical low.

The GIO driver 190 includes a PMOS transistor 191 and a NMOS transistor 192.

The PMOS transistor 191 is connected between a power supply voltage VDD and an output node OUT2 and is turned on or off in response to the control logic signal G1. The NMOS transistor 192 is connected between the output node OUT2 and a ground voltage VSS and is turned on or off in response to the control logic signal G2. Consequently, when any one of the PMOS transistor 191 and the NMOS transistor 192 is turned on, amplified data RP2H of a logical high or low are output from the output node OUT2.

Alternatively, when the output data width of the data output circuit 100 is set to H bits, the data width selection signal XAD may be enabled, and when the output data width of the data output circuit 100 is set to 2H bits, the data width selection signal XAD may be disabled.

In this case, when the data width selection signal XAD is disabled, the sense amplifier circuits S1 to SH sense and amplify the read data R1 to RH, respectively. Furthermore, when the data width selection signal XAD is enabled, the sense amplifier circuits S1 to SH sense and amplify the read data R2H to R(H+1) or the read data R1 to RH, respectively.

Referring back to FIG. 2, the pipeline latch unit 110 includes latch circuits PL1 to PL2H.

The latch circuits PL1 to PL2H latch the amplified data RP1 to RP2H received through the GIO lines GIO1 to GIO2H, respectively, in response to latch control signals C1 to C2H, respectively, and output latched data RD1 to RD2H or stops the latch operation and the output operation. Preferably, when the latch control signals C1 to C2H are respectively enabled, the latch circuits PL1 to PL2H are respectively enabled to execute the latch operation and the output operation.

The output driver circuit unit 120 includes output drivers DR1 to DR2H.

The output drivers DR1 to DR2H output output data DO1 to DO2H, respectively, in response to the latched data RD1 to RD2H, respectively, when they receive the latched data RD1 to RD2H. Furthermore, the output drivers DR1 to DR2H stop the output operation of the output data DO1 to DO2H when they do not receive the latched data RD1 to RD2H, respectively.

Figure 5:
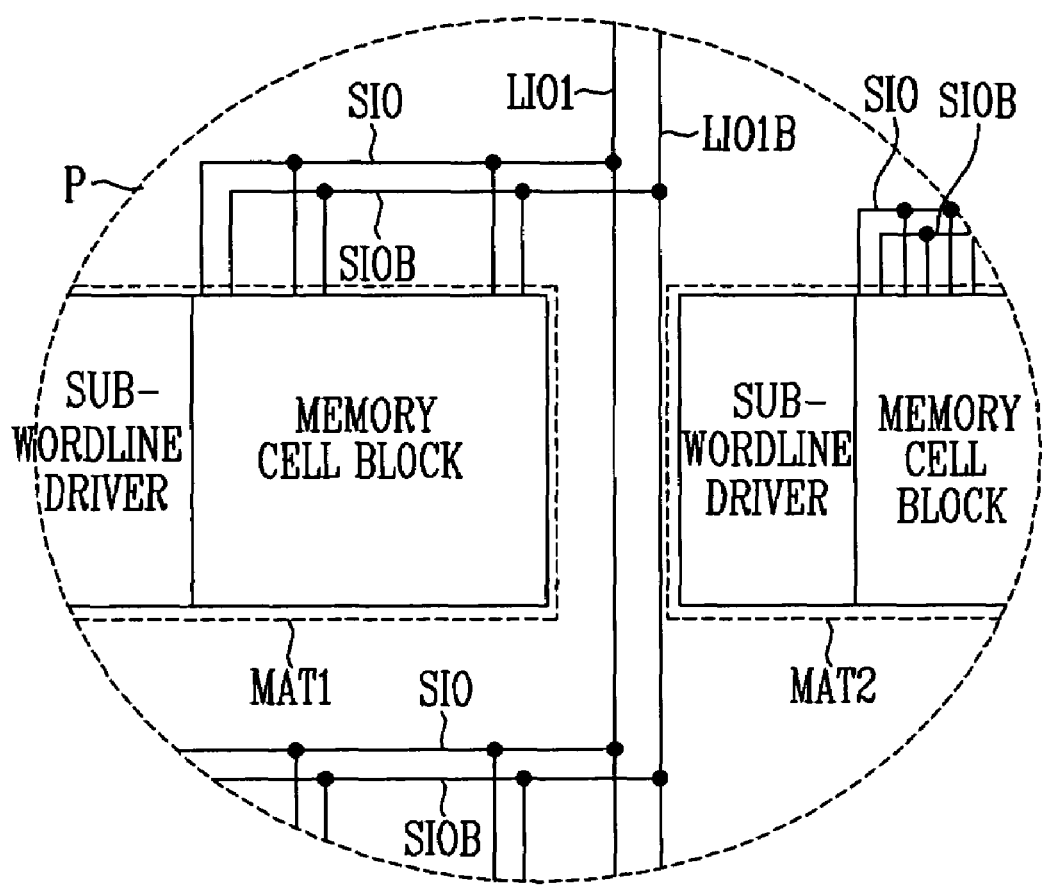
FIG. 5 is an exaggerated view of a region P in FIG. 2 according to an embodiment of the present invention.

FIG. 5 is an exaggerated view of a region P in FIG. 2.

In the region P are disposed memory cell mat MAT1, MAT2 with a predetermined distance therebetween. Each of the memory cell mats MAT1, MAT2 includes a sub-word line driver and a memory cell block. The memory cell block of each of the memory cell mats MAT1, MAT2 has a predetermined number of memory cells. Section I/O lines section input output lines SIO, SIOB connected to the memory cell block as the I/O paths of data of the memory cell block are connected to the LIO line LIO1 and the LIO bar line LIO1B, respectively.

The data output operation of the data output circuit 100 will be described in more detail below.

The data read operation of the data output circuit 100 in the case where a semiconductor memory device includes two memory banks B1, BM will be described for convenience of description. It is also assumed that each of the memory banks B1, BM includes 32 LIO lines LIO1 to LIO32. In this case, the output data width of the semiconductor memory device including the data output circuit 100 may be set to 16 bits X16 or 32 bits (X32).

The operation of the data output circuit 100 when the output data width is set to X16 will be described first. In this case, the data width selection signal XAD and the sensing enable signal SAEN2 are disabled and the sensing enable signal SAEN1 is enabled. As a result, the sense amplifier circuits S17 to S32 of each of the I/O sense amplifier units SA1, SAM are all disabled and do not execute the sensing and amplification operations.

First, all the memory banks B1, BM become active and one (for example, WL1) of word lines WL1 to WLN (N is an integer) of each of the memory banks B1, BM becomes active. At this time, an example in which data read from memory cells connected to the word line WL1 of the memory bank B1 are R1 to R16 and data read from memory cells connected to the word line WL1 of the memory bank BM are R17 to R32 can be taken into consideration.

The sense amplifier circuits S1 to S16 of the I/O sense amplifier unit SA1 are respectively enabled in response to the sensing enable signal SAEN1 and receive the read data R1 to R16 from the memory bank B1 through the LIO lines LIO1 to LIO16, respectively, in synchronization with the strobe signal STB1.

The sense amplifier circuits S1 to S16 of the I/O sense amplifier unit SA1 sense and amplify the read data R1 to R16 and output the amplified data RP1 to RP16 to the GIO lines GIO1 to GIO16, respectively. At this time, the latch control signals C1 to C16 are enabled and the latch control signals C17 to C32 are disabled.

The latch circuits PL1 to PL16 of the pipeline latch unit 110 latch the amplified data RP1 to RP16, respectively, which are received through the GIO lines GIO1 to GIO16, respectively, in response to the latch control signals C1 to C16 and output the latched data RD1 to RD16, respectively. The output drivers DR1 to DR16 of the output driver circuit unit 120 output the output data DO1 to DO16, respectively, in response to the latched data RD1 to RD16.

Meanwhile, after a given period of time elapsed since the strobe signal STB1 is input to each of the sense amplifier circuits S1 to S16 of the I/O sense amplifier unit SA1, the strobe signal STBM is input to each of the sense amplifier circuits S1 to S16 of the I/O sense amplifier unit SAM.

The sense amplifier circuits S1 to S16 of the I/O sense amplifier unit SAM are respectively enabled in response to the sensing enable signal SAEN1 and receive the read data R32 to R17, respectively, from the memory bank BM through the LIO lines LIO1 to LIO16 in synchronization with the strobe signal STBM. The sense amplifier circuits S1 to S16 of the I/O sense amplifier unit SAM sense and amplify the read data R32 to R17, respectively, and output the amplified data RP1 to RP16 to the GIO lines GIO1 to GIO16, respectively. At this time, the latch control signals C1 to C16 are enabled again and the latch control signals C17 to C32 keep disabled.

The latch circuits PL1 to PL16 of the pipeline latch unit 110 latch the amplified data RP1 to RP16, respectively, which are received through the GIO lines GIO1 to GIO16 in response to the latch control signals C1 to C16, respectively, and output the latched data RD1 to RD16, respectively. The output drivers DR1 to DR16 of the output driver circuit unit 120 output the output data DO1 to DO16, respectively, in response to the latched data RD1 to RD16, respectively.

Consequently, the read data R1 to R16 read from the memory cells connected to the word line WL1 of the memory bank B1 are output to the output data DO1 to DO16 and the read data R32 to R17 read from the memory cells connected to the word line WL1 of the memory bank BM are output to the output data DO1 to DO16, by means of the read operation of the data output circuit 100.

In the case where the output data width is set to X16 as described above, the data output circuit 100 does not use the GIO lines GIO17 to GIO32, the sense amplifier circuits S17 to S32, the latch circuits PL17 to PL32, and the output drivers DR17 to DR32. Furthermore, since the I/O sense amplifier units SA1, SAM selectively sense and amplify the read data R1 to R16 or the read data R32 to R17, the data output circuit 100 does not need to include an additional multiplexer circuit unit for selecting read data. Accordingly, the occupation area of the data output circuit 100 can be reduced, the size of semiconductor memory devices can be reduced.

The operation of the data output circuit 100 when the output data width is set to X32 will be described below. In this case, the data width selection signal XAD and the sensing enable signals SAEN1, SAEN2 are all enabled. As a result, the sense amplifier circuits S1 to S32 of each of the I/O sense amplifier units SA1, SAM are enabled to perform the sensing and amplification operations.

First, all the memory banks B1, BM become active and two word lines (for example, WL1, WLN) of the word lines WL1 to WLN (N is an integer) of each of the memory banks B1, BM become active at the same time.

At this time, it is assumed that in the memory bank B1, data read from memory cells connected to the word line WL1 are R1 to R16 and data read from memory cells connected to the word line WLN are R17 to R32. It is also assumed that in the memory bank BM, data read from memory cells connected to the word line WL1 are R17 to R32 and data read from memory cells connected to the word line WLN are R1 to R16.

The sense amplifier circuits S1 to S32 of the I/O sense amplifier unit SA1 are respectively enabled in response to the sensing enable signals SAEN1, SAEN2. The sense amplifier circuits S1 to S16 of the I/O sense amplifier unit SA1 receive the read data R1 to R16 from the memory bank B1 through the LIO lines LIO1 to LIO16, respectively, in synchronization with the strobe signal STB1.

Furthermore, the sense amplifier circuits S17 to S32 of the I/O sense amplifier unit SA1 receive the read data R17 to R32 from the memory bank B1 through the LIO lines LIO17 to LIO32, respectively, in synchronization with the strobe signal STB1. The sense amplifier circuits S1 to S32 of the I/O sense amplifier unit SA1 sense and amplify the read data R1 to R32, respectively, and output the amplified data RP1 to RP32 to the GIO lines GIO1 to GIO32, respectively. At this time, the latch control signals C1 to C32 are enabled.

The latch circuits PL1 to PL32 of the pipeline latch unit 110 latch the amplified data RP1 to RP32, respectively, which are received through the GIO lines GIO1 to GIO32, respectively, in response to the latch control signals C1 to C32 and output the latched data RD1 to RD32, respectively. The output drivers DR1 to DR32 of the output driver circuit unit 120 output the output data DO1 to DO32, respectively, in response to the latched data RD1 to RD32.

Meanwhile, the strobe signal STBM is input to each of the sense amplifier circuits S1 to S32 of the I/O sense amplifier unit SAM after a given time period elapsed since the strobe signal STB1 is input to each of the sense amplifier circuits S1 to S32 of the I/O sense amplifier unit SA1. The sense amplifier circuits S1 to S32 of the I/O sense amplifier unit SAM are enabled in response to the sensing enable signals SAEN1, SAEN2.

The sense amplifier circuits S1 to S16 of the I/O sense amplifier unit SAM receive the read data R1 to R16, respectively, from the memory bank BM through the LIO lines LIO1 to LIO16 in synchronization with the strobe signal STBM. Furthermore, the sense amplifier circuits S17 to S32 of the I/O sense amplifier unit SAM receive the read data R17 to R32, respectively, from the memory bank BM through the LIO lines LIO17 to LIO32 in synchronization with the strobe signal STBM.

The sense amplifier circuits S1 to S32 of the I/O sense amplifier unit SAM sense and amplify the read data R1 to R32, respectively, and output the amplified data RP1 to RP32 to the GIO lines GIO1 to GIO32, respectively. At this time, the latch control signals C1 to C32 are enabled again. The latch circuits PL1 to PL32 latch the amplified data RP1 to RP32, respectively, which are received through the GIO lines GIO1 to GIO32, respectively, in response to the latch control signals C1 to C32, and output the latched data RD1 to RD32, respectively. The output drivers DR1 to DR32 output the output data DO1 to DO32, respectively, in response to the latched data RD1 to RD32, respectively.

Consequently, the data output circuit 100 first outputs the read data R1 to R16 read from the memory cells connected to the word line WL1 of the memory bank B1 and the read data R17 to R32 read from the memory cells connected to the word line WLN as the output data DO1 to DO32.

Thereafter, the data output circuit 100 outputs the read data R1 to R16 read from the memory cells connected to the word line WLN of the memory bank BM and the read data R17 to R32 read from the memory cells connected to the word line WL1 as the output data DO1 to DO32.

In the case where the output data width is set to X32, the data output circuit 100 uses all of the GIO lines GIO1 to GIO32, the sense amplifier circuits S1 to S32, the latch circuits PL1 to PL32, and the output drivers DR1 to DR32.

As described above, the I/O sense amplifier units SA1, SAM selectively sense and amplify the read data R1 to RH or the read data R(H+1) to R2H and the GIO lines GIO1 to GIO2H are selectively used according to a predetermined output data width. Accordingly, the data output circuit 100 can perform an accurate read operation on activated memory banks although a plurality of memory banks become active at the same time.

As described above, in accordance with the data output circuit of the semiconductor memory device and data output method thereof according to an embodiment of the present invention, a part or all of global I/O lines are selectively used according to a selected output data width during the read operation. It is therefore possible to reduce the ratio in which failure in the read operation occurs.

Furthermore, in accordance with the data output circuit of the semiconductor memory device and data output method thereof according to an embodiment of the present invention, it is not necessary to include an additional multiplexer circuit unit for selecting read data. Accordingly, an occupation area can be reduced and the size of semiconductor memory devices can be reduced.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A data output circuit of a semiconductor memory device, the data output circuit comprising:
    an I/O sense amplifier unit that selectively senses and amplifies a part or all of read data received from a memory bank through a Local Input and Output (LIO) lines and outputs amplified data to a part of all of Global I/O (GIO) lines, respectively, in response to a data width selection signal;
    a pipeline latch unit that latches the amplified data received through a part or all of the GIO lines and outputs latched data, in response to latch control signals; and
    an output driver circuit unit that outputs output data in response to the latched data,
    wherein the number of the output data is changed according to an output data width selected by the data width selection signal;
    wherein when the output data width is set to the H bits, the I/O sense amplifier unit selectively senses and amplifies first to $H^{th}$ read data received through the first to $H^{th}$ LIO lines or $(H+1)^{th}$ to secondH read data received through the $(H+1)^{th}$ to secondH LIO lines, and outputs H amplified data to the first to $H^{th}$ GIO lines, respectively, in response to the data width selection signal.

2. The data output circuit as claim in claim 1, wherein the LIO lines comprise first to secondH (H is an integer) LIO lines,
    the GIO lines comprise first to secondH GIO lines,
    the read data include first to secondH read data,
    the output data width is set to either H bits or 2H bits.

3. The data output circuit as claimed in claim 2, wherein when the output data width is set to the 2H bits, the I/O sense amplifier unit senses and amplifies all the first to secondH read data received through the first to secondH LIO lines, and outputs 2H amplified data to the first to secondH GIO lines, respectively, in response to the data width selection signal.

4. The data output circuit as claimed in claim 2, wherein the amplified data include first to secondH amplified data, and the I/O sense amplifier unit comprises:
    first to $H^{th}$ sense amplifier circuits that sense and amplify the first to $H^{th}$ read data, respectively, or sense and amplify the $(H+1)^{th}$ to secondH read data, respectively, and output the first to $H^{th}$ amplified data to the first to $H^{th}$ GIO lines, respectively, in response to the data width selection signal; and
    $(H+1)^{th}$ to secondH sense amplifier circuits that sense and amplify the $(H+1)^{th}$ to secondH read data, respectively, and output the $(H+1)^{th}$ to the secondH amplified data to the $(H+1)^{th}$ to secondH GIO lines, respectively, or stop an output operation, in response to the data width selection signal.

5. The data output circuit as claimed in claim 4, wherein when the first to $H^{th}$ sense amplifier circuits sense and amplify the $(H+1)^{th}$ to secondH read data, respectively, and output the first to $H^{th}$ amplified data to the first to $H^{th}$ GIO lines, respectively, the $(H+1)^{th}$ to secondH sense amplifier circuits stop an output operation of the $(H+1)^{th}$ to secondH amplified data.

6. The data output circuit as claimed in claim 4, wherein each of the first to $H^{th}$ sense amplifier circuits comprises:
    an I/O sense amplifier that senses and amplifies one of the first to $H^{th}$ read data and outputs first internal amplified data, in response to a sensing enable signal and a strobe signal;
    an output logic circuit that outputs second internal amplified data in response to one of the $(H+1)^{th}$ to secondH read data and the data width selection signal;
    a control logic circuit that outputs a control logic signal in response to one of the first and second internal amplified data; and
    an output circuit that generates one of the first to $H^{th}$ amplified data and outputs the generated data to one of the first to $H^{th}$ GIO lines, in response to the control logic signal.

7. The data output circuit as claimed in claim 4, wherein each of the $(H+1)^{th}$ to secondH sense amplifier circuits comprises:
    an I/O sense amplifier that senses and amplifies one of the $(H+1)^{th}$ to secondH read data and outputs internal amplified data, in response to a sensing enable signal and a strobe signal;
    a control logic circuit that outputs a control logic signal in response to the data width selection signal and the internal amplified data; and
    an output circuit that generates one of the $(H+1)^{th}$ to secondH amplified data and outputs the generated data to one of the $(H+1)^{th}$ to secondH GIO lines or does not output the data, in response to the control logic signal.

8. The data output circuit as claimed in claim 2, wherein the latch control signals include first to secondH latch control signals,
    the latched data include first to secondH latch data,
    the amplified data include first to secondH amplified data, and
    the pipeline latch unit comprises first to secondH latch circuits that latch the first to secondH amplified data, respectively, and output the first to secondH latch data, respectively, or stop a latch operation and an output operation, in response to the first to secondH latch control signals, respectively.

9. The data output circuit as claimed in claim 8, wherein when the output data width is set to the H bits, the first to $H^{th}$ latch circuits execute the latch operation and the output operation in response to the first to $H^{th}$ latch control signals, respectively, and
    the $(H+1)^{th}$ to secondH latch circuits stop the latch operation and the output operation in response to the $(H+1)^{th}$ to secondH latch control signals, respectively.

10. The data output circuit as claimed in claim 8, wherein when the output data width is set to 2H bits, all the first to secondH latch circuits execute the latch operation and the output operation.

11. The data output circuit as claimed in claim 2, wherein the latched data include first to secondH latch data,
    the output data include first to secondH output data, and
    the output driver circuit unit comprises first to secondH output drivers that output the first to secondH output data, respectively, in response to the first to secondH latch data, respectively, when receiving the first to secondH latch data, respectively.

12. The data output circuit as claimed in claim 11, wherein when the output data width is set to the H bits, the first to $H^{th}$ output drivers output the first to $H^{th}$ output data, respectively, in response to the first to $H^{th}$ latch data, respectively, and
the $(H+1)^{th}$ to the secondH output drivers stops an output operation of the $(H+1)^{th}$ to secondH output data.

13. The data output circuit as claimed in claim 11, wherein when the output data width is set to the 2H bits, the first to $H^{th}$ output drivers output the first to secondH output data, respectively, in response to the first to secondH latch data, respectively.

14. The data output circuit as claimed in claim 1, wherein the data width selection signal is a row address signal.

15. The data output circuit as claimed in claim 4, wherein the memory bank comprises a plurality of word lines,
in a read operation when the output data width is set to the H bits, one of the plurality of word lines becomes active, and
the first to $H^{th}$ sense amplifier circuits sense and amplify the first to $H^{th}$ read data or the $(H+1)^{th}$ to secondH read data, which are received from memory cells connected to the activated word line, in response to the data width selection signal.

16. The data output circuit as claimed in claim 4, wherein the memory bank comprises a plurality of word lines,
in a read operation when the output data width is set to the 2H bits, at least two of the plurality of word lines become active, and
the first to Hth sense amplifier circuits sense and amplify the first to $H^{th}$ read data, respectively, which are received from first memory cells connected to one of the at least two word lines, in response to the data width selection signal, and the $(H+1)^{th}$ to secondH sense amplifier circuits sense and amplify the $(H+1)^{th}$ to secondH read data, respectively, which are received from second memory cells connected to the other of the at least two word lines, in response to the data width selection signal.

17. A data output circuit of a semiconductor memory device, the data output circuit comprising:
first to $M^{th}$ I/O sense amplifier units disposed corresponding to first to $M^{th}$ (M is an integer) memory banks one by one, for selectively sensing and amplifying a part or all of read data, which are received from the first to $M^{th}$ memory banks, and outputting amplified data to a part or all of GIO lines, respectively, in response to a data width selection signal;
a pipeline latch unit that latches the amplified data received through a part or all of the GIO lines and outputs latched data, in response to latch control signals; and
an output driver circuit unit that outputs output data in response to the latched data,
wherein the number of the output data is changed according to an output data width selected by the data width selection signal, and when one of the first to $M^{th}$ I/O sense amplifier units outputs the amplified data to a part or all of the GIO lines, respectively, the remaining ones of the first to $M^{th}$ I/O sense amplifier units stops an output operation of the amplified data;
wherein when the output data width is set to the H bits, each of the first to $M^{th}$ I/O sense amplifier units selectively senses and amplifies the first to $H^{th}$ read data, which are received through the first to $H^{th}$ LIO lines of a memory bank corresponding to itself, of the first to $M^{th}$ memory banks, or the $(H+1)^{th}$ to secondH read data, which are received through the $(H+1)^{th}$ to secondH LIO lines, respectively, and outputs H amplified data to the first to $H^{th}$ GIO lines, respectively, in response to the data width selection signal.

18. The data output circuit as claimed in claim 17, wherein each of the first to $M^{th}$ th memory banks comprises first to secondH (H is an integer) LIO lines,
the GIO lines comprise first to secondH GIO lines,
the read data of each of the first to $M^{th}$ memory banks include first to secondH read data, and
the output data width is set to either H bits or 2H bits.

19. The data output circuit as claimed in claim 18, wherein when the output data width is set to the 2H bits, each of the first to $M^{th}$ I/O sense amplifier units senses and amplifies the first to secondH read data, which are received through the first to secondH LIO lines of a memory bank corresponding to itself, of the first to memory banks, and outputs 2H amplified data to the first to secondH GIO lines, respectively, in response to the data width selection signal.

20. The data output circuit as claimed in claim 18, wherein the amplified data include first to secondH amplified data, and
each of the first to $M^{th}$ I/O sense amplifier units comprises:
first to $H^{th}$ sense amplifier circuits that sense and amplify the first to $H^{th}$ read data or the $(H+1)^{th}$ to secondH read data, respectively, of a memory bank corresponding to themselves, of the first to $M^{th}$ memory banks and output the first to $H^{th}$ amplified data to the first to $H^{th}$ GIO lines, respectively, in response to the data width selection signal; and
$(H+1)^{th}$ to secondH sense amplifier circuits sense and amplify the $(H+1)^{th}$ to secondH read data, respectively, of the memory bank corresponding to themselves and output the $(H+1)^{th}$ to secondH amplified data to the $(H+1)^{th}$ to secondH GIO lines, respectively, or stop an output operation, in response to the data width selection signal.

21. The data output circuit as claimed in claim 20, wherein when the first to $H^{th}$ sense amplifier circuits sense and amplify the $(H+1)^{th}$ to secondH read data, respectively, and output the first to Hth amplified data to the first to $H^{th}$ GIO lines, respectively, the $(H+1)^{th}$ to secondH sense amplifier circuits stop an output operation of the $(H+1)^{th}$ to secondH amplified data.

22. The data output circuit as claimed in claim 20, wherein each of the first to $H^{th}$ sense amplifier circuits comprises:
an I/O sense amplifier that senses and amplifies one of the first to $H^{th}$ read data and outputs first internal amplified data, in response to a sensing enable signal and a strobe signal;
an output logic circuit that outputs second internal amplified data in response to one of the $(H+1)^{th}$ to secondH read data and the data width selection signal;
a control logic circuit that outputs a control logic signal in response to one of the first and second internal amplified data; and
a GIO driver that generates one of the first to $H^{th}$ amplified data and outputs the generated data to one of the first to $H^{th}$ GIO lines, in response to the control logic signal.

23. The data output circuit as claimed in claim 22, wherein the output logic circuit maintains the second internal amplified data to a first logic level when the data width selection signal is enabled and outputs the second internal amplified data as a second or third logic level according to a logic level of one of the $(H+1)^{th}$ to secondH read data when the data width selection signal is disabled, and
the control logic circuit outputs the control logic signal in response to the first internal amplified data when the second internal amplified data is the first logic level and outputs the control logic signal in response to the second internal amplified data when the second internal amplified data is the second or third logic level.

24. The data output circuit as claimed in claim 20, wherein each of the $(H+1)^{th}$ to secondH sense amplifier circuits comprises:
  an I/O sense amplifier that senses and amplifies one of the $(H+1)^{th}$ to secondH read data and outputs internal amplified data, in response to a sensing enable signal and a strobe signal;
  a control logic circuit that outputs a control logic signal in response to the data width selection signal and the internal amplified data; and
  a GIO driver that generates one of the $(H+1)^{th}$ to secondH amplified data and outputs the generated data to one of the $(H+1)^{th}$ to secondH GIO lines or does not output the data, in response to the control logic signal.

25. The data output circuit as claimed in claim 24, wherein the control logic circuit outputs a control logic signal in response to the internal amplified data when the data width selection signal is enabled and fixes the control logic signal to a predetermined logic level when the data width selection signal is disabled, and
  the GIO driver stops the output operation when the control logic signal is fixed to the predetermined logic level.

26. The data output circuit as claimed in claim 18, wherein the latch control signals include first to secondH latch control signals,
  the latched data include first to secondH latch data,
  the amplified data of each of the first to memory banks include first to secondH amplified data, and
  the pipeline latch unit comprises first to secondH latch circuits that latch the first to secondH amplified data, respectively, and output the first to secondH latch data, respectively, or stop a latch operation and an output operation, in response to the first to secondH latch control signals, respectively.

27. The data output circuit as claimed in claim 26, wherein when the output data width is set to the H bits, the first to $H^{th}$ latch circuits execute the latch operation and the output operation in response to the first to $H^{th}$ latch control signals, respectively, and
  the $(H+1)^{th}$ to secondH latch circuits stop the latch operation and the output operation in response to the $(H+1)^{th}$ to secondH latch control signals, respectively.

28. The data output circuit as claimed in claim 26, wherein when the output data width is set to the 2H bits, all the first to secondH latch circuits execute the latch operation and the output operation.

29. The data output circuit as claimed in claim 18, wherein the latched data include first to secondH latch data,
  the output data include first to secondH output data, and
  the output driver circuit unit comprises first to secondH output drivers that output the first to secondH output data, respectively, in response to the first to secondH latch data, respectively, when receiving the first to secondH latch data, respectively.

30. The data output circuit as claimed in claim 29, wherein when the output data width is set to the H bits, the first to $H^{th}$ output drivers output the first to $H^{th}$ output data, respectively, in response to the first to $H^{th}$ latch data, respectively, and
  the $(H+1)^{th}$ to the secondH output drivers stops an output operation of the $(H+1)^{th}$ to secondH output data.

31. The data output circuit as claimed in claim 29, wherein when the output data width is set to the 2H bits, the first to $H^{th}$ output drivers output the first to secondH output data, respectively, in response to the first to secondH latch data, respectively.

32. The data output circuit as claimed in claim 17, wherein the data width selection signal is a row address signal.

33. A data output method of a data output circuit included in a semiconductor memory device having a plurality of memory banks, the data output method comprising the steps of:
  when a part or all of the plurality of memory banks are activated, selectively sensing and amplifying a part or all of read data of each of the activated memory banks in response to a data width selection signal, and sequentially outputting amplified data respectively corresponding to the activated memory banks to a part or all of GIO lines on the basis of amplified data corresponding to one memory bank;
  latching the amplified data received through a part or all of the GIO lines, respectively, and outputting latched data, in response to latch control signals; and
  outputting output data in response to the latched data,
  wherein the number of the output data is changed according to an output data width selected by the data width selection signal;
  wherein when the output data width is set to the H bits, the amplified data corresponding to the one memory bank include first to $H^{th}$ amplified data, and
  the step of outputting the amplified data comprises the steps of:
  selectively sensing and amplifying the first to $H^{th}$ read data received through the first to $H^{th}$ LIO lines of each of the activated memory banks, or the $(H+1)^{th}$ to secondH read data received through the $(H+1)^{th}$ to secondH LIO lines of each of the activated memory banks, and generating the first to $H^{th}$ amplified data, in response to the data width selection signal; and
  sequentially outputting the first to $H^{th}$ amplified data corresponding to one of the activated memory banks to the first to $H^{th}$ GIO lines.

34. A data output method of a data output circuit included in a semiconductor memory device having a plurality of memory banks, the data output method comprising the steps of:
  when a part or all of the plurality of memory banks are activated, selectively sensing and amplifying a part or all of read data of each of the activated memory banks in response to a data width selection signal, and sequentially outputting amplified data respectively corresponding to the activated memory banks to a part or all of GIO lines on the basis of amplified data corresponding to one memory bank;
  latching the amplified data received through a part or all of the GIO lines, respectively, and outputting latched data, in response to latch control signals; and
  outputting output data in response to the latched data,
  wherein the number of the output data is changed according to an output data width selected by the data width selection signal;
  wherein when the output data width is set to the 2H bits, the amplified data corresponding to the one memory bank include first to secondH amplified data, and
  the step of outputting the amplified data comprises the steps of:
  sensing and amplifying the first to secondH read data received through the first to secondH LIO lines of each of the activated memory banks and generating the first to secondH amplified data, in response to the data width selection signal; and
  sequentially outputting the first to secondH amplified data corresponding to one of the activated memory banks to the first to secondH GIO lines.

* * * * *